(12) United States Patent
Ikeda et al.

(10) Patent No.: US 11,990,480 B2
(45) Date of Patent: May 21, 2024

(54) DISPLAY DEVICE AND ARRAY SUBSTRATE

(71) Applicant: Japan Display Inc., Tokyo (JP)

(72) Inventors: Masanobu Ikeda, Minato-ku (JP);
Yasuhiro Kanaya, Minato-ku (JP);
Yoshinori Aoki, Minato-ku (JP)

(73) Assignee: Japan Display Inc., Tokyo (JP)

( * ) Notice: Subject to any disclaimer, the term of this patent is extended or adjusted under 35 U.S.C. 154(b) by 517 days.

(21) Appl. No.: 17/209,314

(22) Filed: Mar. 23, 2021

(65) Prior Publication Data

US 2021/0210513 A1 Jul. 8, 2021

Related U.S. Application Data

(63) Continuation of application No. PCT/JP2019/033808, filed on Aug. 28, 2019.

(30) Foreign Application Priority Data

Sep. 26, 2018 (JP) ................................ 2018-179814

(51) Int. Cl.
*H01L 27/12* (2006.01)
*H01L 25/16* (2023.01)

(52) U.S. Cl.
CPC .......... *H01L 27/124* (2013.01); *H01L 25/167* (2013.01); *H01L 27/1248* (2013.01)

(58) Field of Classification Search
CPC . H01L 27/124; H01L 27/1244; H10K 59/131; H10K 59/1315; H10K 59/179; H10K 59/1795
See application file for complete search history.

(56) References Cited

U.S. PATENT DOCUMENTS

| | | | | |
|---|---|---|---|---|
| 3,739,239 A | * | 6/1973 | Kerr | .................... H01L 23/4824 |
| | | | | 257/E29.175 |
| 6,703,992 B1 | * | 3/2004 | Yamada | ................. H10K 59/12 |
| | | | | 313/518 |

(Continued)

FOREIGN PATENT DOCUMENTS

| | | | | |
|---|---|---|---|---|
| CN | 102741905 A | * | 10/2012 | ......... H01L 27/3276 |
| CN | 103681751 A | * | 3/2014 | ......... H01L 27/1225 |

(Continued)

OTHER PUBLICATIONS

Machine translation, Ma, Chinese Pat. Pub. No. CN109360851A, translation date: Jul. 19, 2023, Clarivate Analytics, all pages. (Year: 2023).*

(Continued)

*Primary Examiner* — Victoria K. Hall
(74) *Attorney, Agent, or Firm* — Maier & Maier, PLLC

(57) ABSTRACT

A display device includes a substrate, a plurality of pixels provided to the substrate, a light emitting element and a plurality of transistors provided to each of the pixels, a plurality of signal lines configured to supply a signal to the pixels, a power supply line configured to supply a drive potential to the pixels, a first metal layer, a second metal layer, and a third metal layer provided in different layers in a direction perpendicular to the substrate, a first insulating film provided between the first metal layer and the second metal layer, and a second insulating film provided between the second metal layer and the third metal layer.

8 Claims, 12 Drawing Sheets

(56) References Cited

U.S. PATENT DOCUMENTS

| | | | |
|---|---|---|---|
| 10,269,977 B2 | 4/2019 | Sasaki et al. | |
| 10,573,239 B2* | 2/2020 | Omata | G09G 3/32 |
| 10,777,136 B2* | 9/2020 | Shibusawa | H10K 59/131 |
| 2002/0149053 A1* | 10/2002 | Tsunoda | H01L 29/78621 257/E27.111 |
| 2003/0025166 A1* | 2/2003 | Yamazaki | H01L 29/78645 257/397 |
| 2004/0046902 A1 | 3/2004 | Yamasaki | |
| 2004/0211964 A1* | 10/2004 | Sakakura | H10K 59/131 257/E27.111 |
| 2005/0110421 A1 | 5/2005 | Matsumoto et al. | |
| 2007/0222936 A1* | 9/2007 | Shih | G02F 1/136286 349/187 |
| 2011/0084267 A1* | 4/2011 | Yamazaki | H01L 29/78606 257/43 |
| 2011/0084337 A1* | 4/2011 | Yamazaki | H01L 27/124 257/E27.111 |
| 2012/0074422 A1* | 3/2012 | Kanegae | H10K 59/123 257/E21.414 |
| 2013/0082270 A1* | 4/2013 | Ono | H01L 27/1248 438/34 |
| 2013/0082271 A1* | 4/2013 | Kanegae | H01L 33/36 438/34 |
| 2013/0187187 A1* | 7/2013 | Matsukura | H01L 33/62 257/99 |
| 2016/0064421 A1* | 3/2016 | Oh | H01L 27/1255 257/43 |
| 2016/0087021 A1* | 3/2016 | Sato | H10K 59/1216 257/43 |
| 2017/0207289 A1* | 7/2017 | Kang | H10K 59/131 |
| 2017/0316730 A1* | 11/2017 | Cheng | G09G 3/2092 |
| 2018/0061927 A1* | 3/2018 | Jeong | H01L 27/1225 |
| 2019/0363151 A1* | 11/2019 | Kim | H10K 59/131 |
| 2020/0111854 A1* | 4/2020 | Chung | H01L 27/1255 |
| 2021/0210513 A1* | 7/2021 | Ikeda | H10K 59/00 |
| 2021/0343823 A1* | 11/2021 | Tanaka | G09G 3/36 |

FOREIGN PATENT DOCUMENTS

| | | | | |
|---|---|---|---|---|
| CN | 105789266 A | * | 7/2016 | G09G 3/3225 |
| CN | 109360851 A | * | 2/2019 | G09G 3/3233 |
| CN | 109994527 A | * | 7/2019 | H10K 59/1216 |
| JP | 2004-102058 A | | 4/2004 | |
| JP | 2004-118013 A | | 4/2004 | |
| JP | 2004118013 A | * | 4/2004 | G09F 9/30 |
| JP | 2004-341513 A | | 12/2004 | |
| JP | 2004341513 A | * | 12/2004 | G09F 9/30 |
| JP | 2005-107168 A | | 4/2005 | |
| JP | 2018-041752 A | | 3/2018 | |
| WO | WO-2012042565 A1 | * | 4/2012 | H10K 59/131 |
| WO | WO-2012042566 A1 | * | 4/2012 | H01L 29/66742 |

OTHER PUBLICATIONS

Machine translation, Kanegae, WIPO Pat. Pub. No. WO2012042566A1, translation date: Jul. 19, 2023, Clarivate Analytics, all pages. (Year: 2023).*

Machine translation, Li, Chinese Pat. Pub. No. CN105789266A, translation date: Jul. 19, 2023, Clarivate Analytics, all pages. (Year : 2023).*

Machine translation, Kanegae, Chinese Pat. Pub. No. CN102741905A, translation date: Jul. 19, 2023, Clarivate Analytics, all pages. (Year: 2023).*

Machine translation, Kanegae, WIPO Pat. Pub. No. WO2012042565A1, translation date: Jul. 19, 2023, Clarivate Analytics, all pages. (Year: 2023).*

Machine translation, Noguchi, Japanese Pat. Pub. No. JP2004118013A, translation date: Jul. 16, 2023, Espacenet, all pages. (Year: 2023).*

Machine translation, Jeon, Chinese Pat. Pub. No. CN103681751A, translation date: Jul. 19, 2023, Clarivate Analytics, all pages. (Year: 2023).*

Machine translation, Lee, Chinese Pat. Pub. No. CN109994527A, translation date: Jul. 19, 2023, Clarivate Analytics, all pages. (Year: 2023).*

Machine translation, Sakakura, Japanese Pat. Pub. No. JP2004341513A, translation date: Jul. 16, 2023, Espacenet, all pages. (Year: 2023).*

Japanese Office Action dated May 10, 2022 in Japanese Patent Application No. 2018-179814 (with English translation), 7 pages.

International Search Report dated Nov. 26, 2019 in PCT/JP2019/033808 filed on Aug. 28, 2019, citing documents AB-AD & AP-AS therein, 5 pages (with English Translation)

* cited by examiner

DISPLAY DEVICE AND ARRAY SUBSTRATE

CROSS-REFERENCE TO RELATED APPLICATION

This application is a continuation of PCT international application Ser. No. PCT/JP2019/033808 filed on Aug. 28, 2019 which designates the United States, incorporated herein by reference, and which claims the benefit of priority from Japanese Patent Application No. 2018-179814, filed on Sep. 26, 2018, incorporated herein by reference.

BACKGROUND

1. Technical Field

The present disclosure relates to a display device and an array substrate.

2. Description of the Related Art

Widely known are display devices including organic light emitting diodes (OLED) or inorganic light emitting diodes (micro LEDs) serving as display elements. Japanese Patent Application Laid-open Publication No. 2018-41752 (JP-A-2018-41752) describes a semiconductor device used as a pixel circuit for display devices or the like. The pixel circuit described in JP-A-2018-41752 includes a plurality of transistors and a plurality of capacitances in each pixel.

The pixel circuit described in JP-A-2018-41752 has a large number of elements (the transistors and the capacitances) in one pixel and a large number of wires coupled to the elements. As a result, it may possibly be difficult to efficiently dispose the wiring.

SUMMARY

A display device according to an embodiment of the present disclosure includes a substrate, a plurality of pixels provided to the substrate, a light emitting element and a plurality of transistors provided to each of the pixels, a plurality of signal lines configured to supply a signal to the pixels, a power supply line configured to supply a drive potential to the pixels, a first metal layer, a second metal layer, and a third metal layer provided in different layers in a direction perpendicular to the substrate, a first insulating film provided between the first metal layer and the second metal layer, and a second insulating film provided between the second metal layer and the third metal layer. The transistors each include a semiconductor layer provided to the substrate, and a gate electrode formed in the first metal layer and provided in a region overlapping the semiconductor layer, and one or more of the signal lines and the power supply line are formed in the third metal layer and electrically coupled to the transistors.

An array substrate according to an embodiment of the present disclosure provided with a plurality of light emitting elements is disclosed. The array substrate includes a substrate, a plurality of transistors provided to the substrate, a plurality of signal lines configured to supply a signal to the light emitting elements, a power supply line configured to supply a drive potential to the light emitting elements, a first metal layer, a second metal layer, and a third metal layer provided in different layers in a direction perpendicular to the substrate, a first insulating film provided between the first metal layer and the second metal layer, and a second insulating film provided between the second metal layer and the third metal layer. The transistors each include a semiconductor layer provided to the substrate, and a gate electrode formed in the first metal layer and provided in a region overlapping the semiconductor layer, and one or more of the signal lines and the power supply line are formed in the third metal layer and electrically coupled to the transistors.

DETAILED DESCRIPTION

Figure 1:
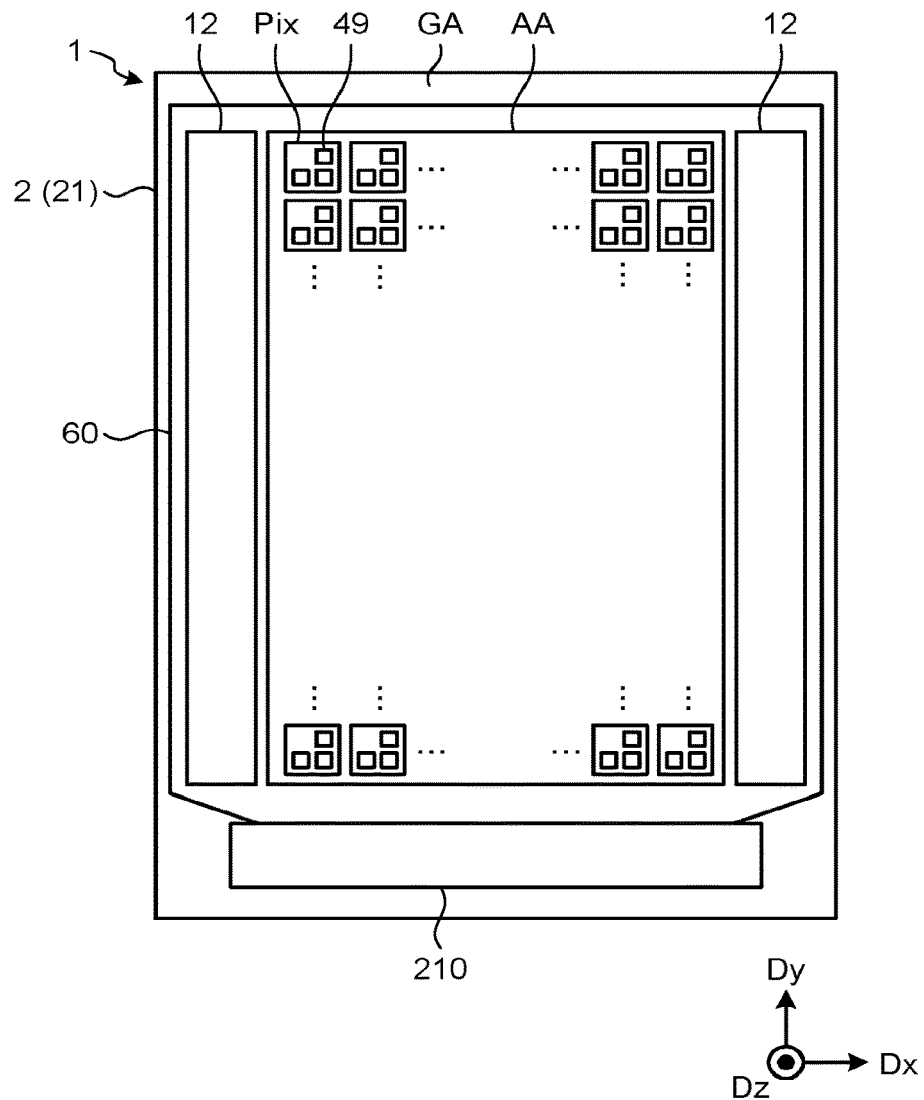
FIG. 1 is a plan view schematically illustrating a display device according to an embodiment.

Exemplary aspects (embodiments) to embody the present disclosure are described below in greater detail with reference to the accompanying drawings. The contents described in the embodiments are not intended to limit the present disclosure. Components described below include components easily conceivable by those skilled in the art and components substantially identical therewith.

Furthermore, the components described below may be appropriately combined. What is disclosed herein is given by way of example only, and appropriate changes made without departing from the spirit of the present disclosure and easily conceivable by those skilled in the art naturally fall within the scope of the disclosure. To simplify the explanation, the drawings may possibly illustrate the width, the thickness, the shape, and other elements of each unit more schematically than the actual aspect. These elements, however, are given by way of example only and are not intended to limit interpretation of the present disclosure. In the present specification and the figures, components similar to those previously described with reference to previous figures are denoted by like reference numerals, and detailed explanation thereof may be appropriately omitted.

Embodiments

FIG. 1 is a plan view schematically illustrating a display device according to an embodiment. As illustrated in FIG. 1, a display device 1 includes an array substrate 2, pixels Pix, drive circuits 12, a drive integrated circuit (IC) 210, and cathode wiring 60. The array substrate 2 is a drive circuit board for driving the pixels Pix and is also called a backplane or an active matrix substrate. The array substrate 2 includes a substrate 21, a plurality of transistors, a plurality of capacitances, and various kinds of wiring, for example.

As illustrated in FIG. 1, the display device 1 has a display region AA and a peripheral region GA. The display region AA is disposed overlapping the pixels Pix and displays an image. The peripheral region GA does not overlap the pixels Pix and is disposed outside the display region AA.

The pixels Pix are arrayed in a first direction Dx and a second direction Dy in the display region AA of the substrate 21. The first direction Dx and the second direction Dy are parallel to the surface of the substrate 21. The first direction Dx is orthogonal to the second direction Dy. The first direction Dx may intersect the second direction Dy without being orthogonal thereto. A third direction Dz is orthogonal to the first direction Dx and the second direction Dy. The third direction Dz corresponds to the normal direction of the substrate 21, for example. In the following description, planar view indicates the positional relation when viewed in the third direction Dz.

The drive circuits 12 drive a plurality of gate lines (e.g., a reset control signal line L5, an output control signal line L6, a pixel control signal line L7, and an initialization control signal line L8 (refer to FIG. 3)) based on various control signals received from the drive IC 210. The drive circuits 12 sequentially or simultaneously select a plurality of gate lines and supply gate drive signals to the selected gate lines. As a result, the drive circuits 12 select a plurality of pixels Pix coupled to the gate lines.

The drive IC 210 is a circuit that controls display on the display device 1. The drive IC 210 is mounted on the peripheral region GA of the substrate 21 as chip on glass (COG). The mounting form of the drive IC 210 is not limited thereto, and the drive IC 210 may be mounted on FPCs or a rigid substrate coupled to the peripheral region GA of the substrate 21 as chip on film (COF).

The cathode wiring 60 is provided in the peripheral region GA of the substrate 21. The cathode wiring 60 is provided surrounding the pixels Pix in the display region AA and the drive circuits 12 in the peripheral region GA. Cathodes of a plurality of light emitting elements 3 are coupled to the common cathode wiring 60 and supplied with a fixed potential (e.g., a ground potential). More specifically, a cathode terminal 22t of the light emitting element 3 is coupled to the cathode wiring 60 via a cathode electrode 22.

Figure 2:
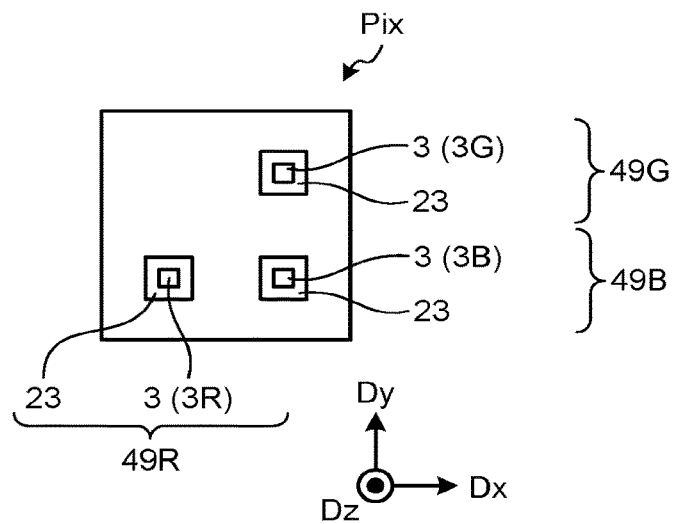
FIG. 2 is a plan view of a plurality of pixels.

FIG. 2 is a plan view of a plurality of pixels. As illustrated in FIG. 2, one pixel Pix includes a plurality of pixels 49. The pixel Pix includes a first pixel 49R, a second pixel 49G, and a third pixel 49B, for example. The first pixel 49R displays a primary color of red as the first color. The second pixel 49G displays a primary color of green as the second color. The third pixel 49B displays a primary color of blue as the third color. As illustrated in FIG. 2, the first pixel 49R and the third pixel 49B are disposed side by side in the first direction Dx in one pixel Pix. The second pixel 49G and the third pixel 49B are disposed side by side in the second direction Dy. The first color, the second color, and the third color are not limited to red, green, and blue, respectively, and may be any desired colors, such as complementary colors. In the following description, the first pixel 49R, the second pixel 49G, and the third pixel 49B are referred to as pixels 49 when they need not be distinguished from one another.

The pixels 49 each include the light emitting element 3 and an anode electrode 23. The display device 1 displays an image by outputting different light from light emitting elements 3R, 3G, and 3B in the first pixel 49R, the second pixel 49G, and the third pixel 49B, respectively. The light emitting element 3 is an inorganic light emitting diode (LED) chip having a size of approximately 3 μm to 300 μm in planar view and is called a micro LED. The display device 1 including the micro LEDs in the respective pixels is also called a micro LED display device. The term "micro" of the micro LED is not intended to limit the size of the light emitting element 3.

The light emitting elements 3 may output different light in four or more colors. The positions of the pixels 49 are not limited to the configuration illustrated in FIG. 2. The first pixel 49R, for example, may be disposed side by side with the second pixel 49G in the first direction Dx. Alternatively, the first pixel 49R, the second pixel 49G, and the third pixel 49B may be repeatedly arrayed in this order in the first direction Dx. The display device 1 is not limited to a micro LED display device and may be a self-luminous display device including organic LEDs (OLEDs) as the display elements or a reflective display device, such as electronic paper.

Figure 3:
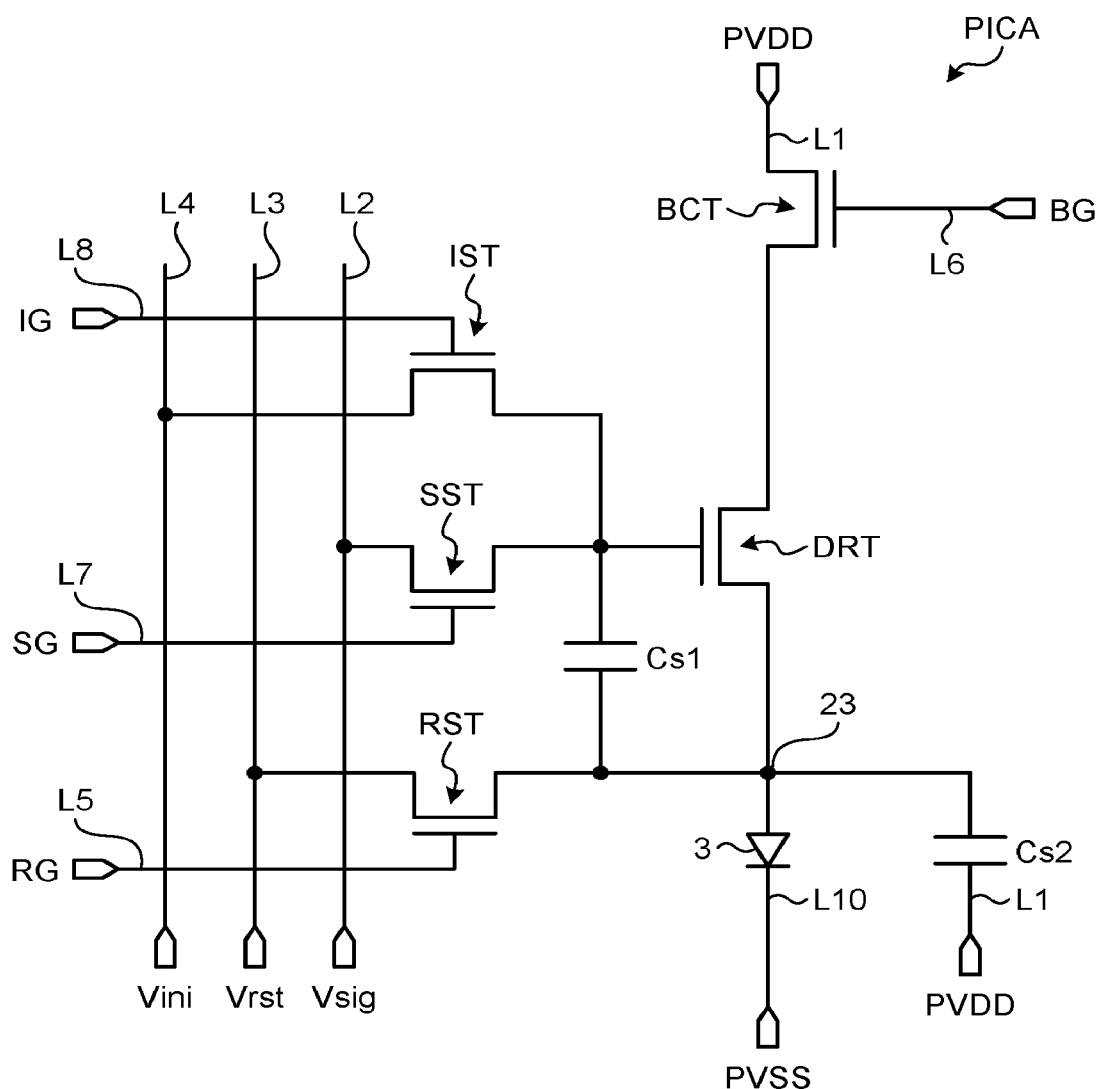
FIG. 3 is a circuit diagram of a pixel circuit.

FIG. 3 is a circuit diagram of a pixel circuit. FIG. 3 illustrates a pixel circuit PICA provided to one pixel 49. The pixel circuit PICA is provided to each of the pixels 49. As illustrated in FIG. 3, the pixel circuit PICA includes the light emitting element 3, five transistors, and two capacitances. Specifically, the pixel circuit PICA includes a drive transistor DRT (first transistor), an output transistor BCT, an initialization transistor IST, a pixel selection transistor SST (second transistor), and a reset transistor RST. The drive transistor DRT, the output transistor BCT, the initialization transistor IST, the pixel selection transistor SST, and the reset transistor RST are n-type thin-film transistors (TFTs). The pixel circuit PICA includes first capacitance Cs1 and second capacitance Cs2.

The cathode (cathode terminal 22t) of the light emitting element 3 is coupled to a cathode power supply line L10. The anode (anode terminal 23t) of the light emitting element 3 is coupled to an anode power supply line L1 via the drive transistor DRT and the output transistor BCT. The anode power supply line L1 is supplied with an anode power supply potential PVDD. The cathode power supply line L10 is supplied with a cathode power supply potential PVSS via the cathode wiring 60 and the cathode electrode 22. The anode power supply potential PVDD is higher than the cathode power supply potential PVSS.

The anode power supply line L1 supplies the anode power supply potential PVDD serving as a drive potential to the pixel 49. Specifically, the light emitting element 3 ideally emits light by being supplied with a forward current (drive current) by a potential difference (PVDD-PVSS) between the anode power supply potential PVDD and the cathode power supply potential PVSS. In other words, the anode power supply potential PVDD has a potential difference to cause the light emitting element 3 to emit light with respect to the cathode power supply potential PVSS. The anode terminal 23t of the light emitting element 3 is coupled to the anode electrode 23. The second capacitance Cs2 serving as an equivalent circuit is coupled between the anode electrode 23 and the anode power supply line L1.

The source electrode of the drive transistor DRT is coupled to the anode terminal 23t of the light emitting element 3 via the anode electrode 23, and the drain electrode thereof is coupled to the source electrode of the output transistor BCT. The gate electrode of the drive transistor DRT is coupled to the first capacitance Cs1, the drain electrode of the pixel selection transistor SST, and the drain electrode of the initialization transistor IST.

The gate electrode of the output transistor BCT is coupled to the output control signal line L6. The output control signal line L6 is supplied with an output control signal BG. The drain electrode of the output transistor BCT is coupled to the anode power supply line L1.

The source electrode of the initialization transistor IST is coupled to an initialization power supply line L4. The initialization power supply line L4 is supplied with an initialization potential Vini. The gate electrode of the initialization transistor IST is coupled to the initialization control signal line L8. The initialization control signal line L8 is supplied with an initialization control signal IG. In other words, the gate electrode of the drive transistor DRT is coupled to the initialization power supply line L4 via the initialization transistor IST.

The source electrode of the pixel selection transistor SST is coupled to a video signal line L2. The video signal line L2 is supplied with a video signal Vsig. The gate electrode of the pixel selection transistor SST is coupled to the pixel control signal line L7. The pixel control signal line L7 is supplied with a pixel control signal SG.

The source electrode of the reset transistor RST is coupled to a reset power supply line L3. The reset power supply line L3 is supplied with a reset power supply potential Vrst. The gate electrode of the reset transistor RST is coupled to the reset control signal line L5. The reset control signal line L5 is supplied with a reset control signal RG. The drain electrode of the reset transistor RST is coupled to the anode terminal 23t of the light emitting element 3 and the source electrode of the drive transistor DRT.

The first capacitance Cs1 serving as an equivalent circuit is provided between the drain electrode of the reset transistor RST and the gate electrode of the drive transistor DRT. The pixel circuit PICA can prevent fluctuations in the gate voltage due to parasitic capacitance and current leakage in the drive transistor DRT by the first capacitance Cs1 and the second capacitance Cs2.

In the following description, the anode power supply line L1 may be simply referred to as a power supply line. The video signal line L2, the reset power supply line L3, and the initialization power supply line L4 may be referred to as signal lines. The reset control signal line L5, the output control signal line L6, the pixel control signal line L7, and the initialization control signal line L8 may be referred to as gate lines.

The gate electrode of the drive transistor DRT is supplied with an electric potential corresponding to the video signal Vsig (or gradation signal). In other words, the drive transistor DRT supplies an electric current corresponding to the video signal Vsig to the light emitting element 3 based on the anode power supply potential PVDD supplied via the output transistor BCT. As described above, the anode power supply potential PVDD supplied to the anode power supply line L1 is lowered by the drive transistor DRT and the output transistor BCT. As a result, an electric potential lower than the anode power supply potential PVDD is supplied to the anode terminal 23t of the light emitting element 3.

A first electrode of the second capacitance Cs2 is supplied with the anode power supply potential PVDD via the anode power supply line L1, and a second electrode of the second capacitance Cs2 is supplied with an electric potential lower than the anode power supply potential PVDD. In other words, the first electrode of the second capacitance Cs2 is supplied with an electric potential higher than that supplied to the second electrode of the second capacitance Cs2. The first electrode of the second capacitance Cs2 is the anode power supply line L1 illustrated in FIG. 6, for example. The second electrode of the second capacitance Cs2 is the anode electrode 23 coupled to the source of the drive transistor DRT and an anode coupling electrode 24 coupled to the anode electrode 23 illustrated in FIG. 5, for example.

In the display device 1, the drive circuits 12 (illustrated in FIG. 1) select a plurality of pixel rows in order from the first row (e.g., the uppermost pixel row in the display region AA in FIG. 1). The drive IC 210 writes the video signals Vsig (video writing potential) to the pixels 49 of the selected pixel row, thereby causing the light emitting elements 3 to emit light. The drive IC 210 supplies the video signals Vsig to the video signal line L2, supplies the reset power supply potential Vrst to the reset power supply line L3, and supplies the initialization potential Vini to the initialization power supply line L4 in each horizontal scanning period. The display device 1 repeats these operations in units of an image of one frame.

Figure 4:
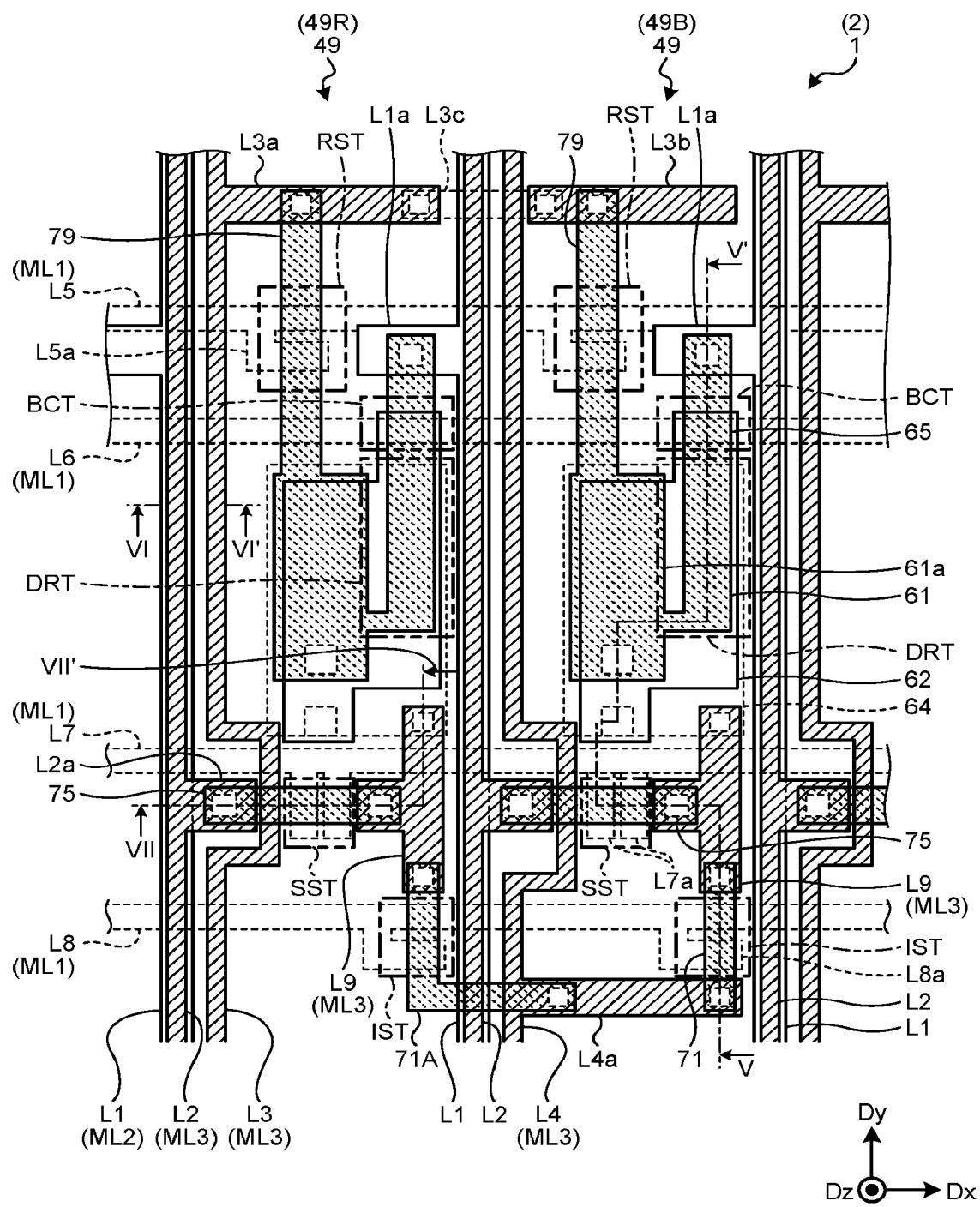
FIG. 4 is an enlarged plan view of two pixels of the display device according to the embodiment.

The following describes a specific configuration example of the transistors and the wires with reference to FIGS. 4 to 7. FIG. 4 is an enlarged plan view of two pixels of the display device according to the embodiment.

FIG. 4 illustrates two pixels 49 (e.g., the first pixel 49R and the third pixel 49B) disposed side by side in the first direction Dx. As illustrated in FIG. 4, the anode power supply line L1, the video signal line L2, the reset power supply line L3, and the initialization power supply line L4 extend in the second direction Dy. The reset control signal line L5, the output control signal line L6, the pixel control signal line L7, and the initialization control signal line L8 extend in the first direction Dx and intersect the anode power supply line L1, the video signal line L2, the reset power supply line L3, and the initialization power supply line L4 in planar view. Coupling wiring L9 is provided between the two anode power supply lines L1 disposed side by side in the first direction Dx. The coupling wiring L9 couples the drive transistor DRT, the pixel selection transistor SST, and the initialization transistor IST.

The display device 1 (array substrate 2) according to the present embodiment includes a first metal layer ML1, a second metal layer ML2, and a third metal layer ML3 provided in different directions in the third direction Dz. The first metal layer ML1, the second metal layer ML2, and the third metal layer ML3 are provided in the layers different from that of semiconductor layers 61, 65, 71, 75, and 79. In FIG. 4, the first metal layer ML1 is represented by the dotted lines, and the second metal layer ML2 and the semiconductor layers 61, 65, 71, 75, and 79 are hatched to distinguish the first metal layer ML1, the second metal layer ML2, the third metal layer ML3, and the semiconductor layers 61, 65, 71, 75, and 79.

The anode power supply line L1 is formed in the second metal layer ML2. The video signal line L2, the reset power supply line L3, the initialization power supply line L4, and the coupling wiring L9 are formed in the third metal layer ML3. The reset control signal line L5, the output control signal line L6, the pixel control signal line L7, and the initialization control signal line L8 are formed in the first metal layer ML1.

The first metal layer ML1, the second metal layer ML2, and the third metal layer ML3 according to the present embodiment are used as various kinds of wiring coupled to a plurality of transistors. The anode power supply line L1 overlaps the video signal line L2 in planar view. This configuration enables efficiently disposing the wiring in each pixel 49 compared with the configuration in which the anode power supply line L1 and the video signal line L2 are provided in the same layer. As a result, the area of each pixel 49 can be reduced in planar view, thereby increasing the resolution of the display device 1.

The first metal layer ML1, the second metal layer ML2, and the third metal layer ML3 are made of titanium (Ti), molybdenum (Mo), tungsten (W), tantalum (Ta), niobium, indium tin oxide (ITO), aluminum (Al), silver (Ag), Ag alloy, copper (Cu), carbon nanotube, graphite, graphene, or carbon nanobud, for example. The sheet resistance of the anode power supply line L1 formed in the second metal layer ML2 is equal to or lower than that of the signal lines formed in the third meatal layer ML3. The sheet resistance of the signal lines is equal to or lower than that of the gate lines formed in the first meatal layer ML1. The sheet resistance of the anode power supply line L1 (second metal layer ML2) is 30 mΩ to 120 mΩ, for example. The sheet resistance of the signal lines (third metal layer ML3) is 120 mΩ to 300 mΩ. The sheet resistance of the gate lines (first metal layer ML1) is 300 mΩ to 3000 mΩ. With this configuration, the display device 1 can prevent a drive voltage applied to the anode power supply line L1 from dropping, thereby reducing deterioration in display quality.

The first metal layer ML1, the second metal layer ML2, and the third metal layer ML3 are not limited to single layers and may be multilayered films. The second metal layer ML2 may be a multilayered film of Ti/Al/Ti or Mo/Al/Mo, for example. The third metal layer ML3 may be a single-layered film made of Al. Ti, Al, and Mo may be alloys.

The semiconductor layers 61, 65, 71, and 75 are made of amorphous silicon, microcrystalline oxide semiconductor, amorphous oxide semiconductor, polycrystalline silicon, low-temperature polycrystalline silicon (LTPS), or gallium nitride (GaN), for example. Examples of the oxide semiconductor include, but are not limited to, IGZO, zinc oxide (ZnO), ITZO, etc. IGZO is indium gallium zinc oxide, and ITZO is indium tin zinc oxide.

As illustrated in FIG. 4, the reset power supply line L3 and the initialization power supply line L4 are shared by the two pixels 49 disposed side by side in the first direction Dx. Specifically, the first pixel 49R illustrated on the left in FIG. 4 is provided not with the initialization power supply line L4 but with the reset power supply line L3 extending along the video signal line L2. The third pixel 49B illustrated on the right in FIG. 4 is provided not with the reset power supply line L3 but with the initialization power supply line L4 extending along the video signal line L2. This configuration requires a smaller number of wires and enables efficiently disposing the wiring compared with the configuration in which the reset power supply line L3 and the initialization power supply line L4 are provided to each of the pixels 49.

The drive transistor DRT (first transistor) includes the semiconductor layer 61, a source electrode 62, and a gate electrode 64. The semiconductor layer 61, the source electrode 62, and the gate electrode 64 partially overlap in planar view and are provided in a region surrounded by the two anode power supply lines L1 disposed side by side in the first direction Dx, the output control signal line L6, and the pixel control signal line L7. The drive transistor DRT has a single-gate structure in which one gate electrode 64 is provided overlapping the semiconductor layer 61.

The semiconductor layer 61 is coupled to a first partial semiconductor layer 61a. The first partial semiconductor layer 61a is provided in the same layer as that of the semiconductor layer 61 and made of the same semiconductor material as that of the semiconductor layer 61. The semiconductor layer 61 is coupled to the source electrode 62 via the first partial semiconductor layer 61a. The first partial semiconductor layer 61a is disposed side by side with the semiconductor layer 61 in the first direction Dx. The width of the first partial semiconductor layer 61a in the first direction Dx is larger than that of the semiconductor layer 61 in the first direction Dx. The first partial semiconductor layer 61a overlaps a gate insulating film 91 (refer to FIG. 5) and the gate electrode 64. The first capacitance Cs1 is formed between the first partial semiconductor layer 61a and the gate electrode 64. The semiconductor layer 61 and the first partial semiconductor layer 61a may be one rectangular semiconductor layer.

The output transistor BCT includes the semiconductor layer 65. The semiconductor layer 65 is coupled to the semiconductor layer 61 and intersects the output control signal line L6 in planar view. A region in the semiconductor layer 65 overlapping the output control signal line L6 serves as a channel region. The part of the output control signal line L6 overlapping the semiconductor layer 65 functions as a gate electrode 66 of the output transistor BCT. One end of the semiconductor layer 65 is electrically coupled to an anode power supply line coupling part L1a. The anode power supply line coupling part L1a is a part branched off from the anode power supply line L1 in the first direction Dx. With this configuration, the drive transistor DRT and the output transistor BCT are supplied with the anode power supply potential PVDD from the anode power supply line L1.

In the third pixel 49B illustrated on the right in FIG. 4, the initialization transistor IST includes the semiconductor layer 71. In the first pixel 49R illustrated on the left in FIG. 4, the initialization transistor IST includes a semiconductor layer 71A. The semiconductor layers 71 and 71A intersect the initialization control signal line L8 and a branch signal line L8a in planar view. A region in the semiconductor layers 71 and 71A overlapping the initialization control signal line L8 and the branch signal line L8a serves as a channel region. The branch signal line L8a is branched off from the initialization control signal line L8 and extends in the first direction Dx. The parts of the initialization control signal line L8 and the branch signal line L8a overlapping the semiconductor layers 71 and 71A each function as a gate electrode 74 of the initialization transistor IST. In other words, the initialization transistor IST has a double-gate structure in which two gate electrodes are provided overlapping the respective semiconductor layers 71 and 71A.

In the third pixel 49B illustrated on the right in FIG. 4, the semiconductor layer 71 extends in the second direction Dy. One end of the semiconductor layer 71 is electrically coupled to the coupling wiring L9, and the other end is coupled to an initialization power supply line coupling part L4a. The initialization power supply line coupling part L4a is a part branched off from the initialization power supply line L4 in the first direction Dx. In the first pixel 49R illustrated on the left in FIG. 4, the semiconductor layer 71A includes a part extending in the second direction Dy and a part extending in the first direction Dx. One end of the part of the semiconductor layer 71A extending in the second direction Dy is electrically coupled to the coupling wiring L9. The part of the semiconductor layer 71A extending in the first direction Dx intersects the anode power supply line L1 and the video signal line L2 in planar view, extends to the third pixel 49B, and is electrically coupled to the initialization power supply line coupling part L4a. With this configuration, one initialization power supply line L4 is electrically coupled to the two initialization transistors IST and shared by the two pixels 49 disposed side by side in the first direction Dx.

The pixel selection transistor SST includes the semiconductor layer 75. The semiconductor layer 75 extends in the first direction Dx and intersects two branch signal lines L7a in planar view. A region in the semiconductor layer 75 overlapping the two branch signal lines L7a serves as a channel region. The two branch signal lines L7a are parts branched off from the pixel control signal line L7 in the second direction Dy. The parts of the two branch signal lines L7a overlapping the semiconductor layer 75 each function as a gate electrode 78 of the pixel selection transistor SST. In other words, the pixel selection transistor SST has a double-gate structure in which two gate electrodes 78 are provided overlapping the semiconductor layer 75. One end of the semiconductor layer 75 is coupled to a video signal line coupling part L2a, and the other end is coupled to the coupling wiring L9. The video signal line coupling part L2a is a part branched off from the video signal line L2 in the first direction Dx. In other words, the pixel selection transistors SST each include the semiconductor layer 75 and the gate electrodes 78. The semiconductor layer 75 is provided on the substrate 21. The gate electrodes 78 are formed in the first metal layer ML1 and provided in a region overlapping the semiconductor layer 75. The video signal line L2 is formed in the third metal layer ML3 and electrically coupled to the pixel selection transistor SST.

The reset transistor RST includes the semiconductor layer 79. The semiconductor layer 79 extends in the second direction Dy and intersects the reset control signal line L5 and a branch signal line L5a in planar view. A region in the semiconductor layer 79 overlapping the reset control signal line L5 and the branch signal line L5a serves as a channel region. The branch signal line L5a is branched off from the reset control signal line L5 and extends in the first direction Dx. The parts of the reset control signal line L5 and the branch signal line L5a overlapping the semiconductor layer 79 each function as a gate electrode of the reset transistor RST. In other words, the reset transistor RST has a double-gate structure.

The reset power supply line L3 is coupled to reset power supply line coupling parts L3a and L3b and a bridge L3c extending in the first direction Dx. The reset power supply line coupling parts L3a and L3b are formed in the third metal layer ML3. The bridge L3c is formed in a layer different from that of the reset power supply line coupling parts L3a and L3b, that is, the first metal layer ML1, for example. The reset power supply line coupling part L3a is provided to the first pixel 49R, and the reset power supply line coupling part L3b is provided to the third pixel 49B. The anode power supply line L1, the video signal line L2, and the initialization power supply line L4 are provided between the reset power supply line coupling parts L3a and L3b. The bridge L3c intersects the anode power supply line L1, the video signal line L2, and the initialization power supply line L4 in planar view and couples the reset power supply line coupling parts L3a and L3b.

In the first pixel 49R, one end of the semiconductor layer 79 is coupled to the reset power supply line coupling part L3a. In the third pixel 49B, one end of the semiconductor layer 79 is coupled to the reset power supply line coupling part L3b. The other ends of the semiconductor layers 79 are each electrically coupled to the semiconductor layer 65 via the first partial semiconductor layer 61a. In other words, the other end of the semiconductor layer 79 of the reset transistor RST is electrically coupled to the anode terminal 23t of the light emitting element 3 via the semiconductor layer 65 and the source electrode 62. With this configuration, one reset power supply line L3 is electrically coupled to the two reset transistors RST and shared by the two pixels 49 disposed side by side in the first direction Dx.

The drive transistor DRT and the output transistor BCT that supply the drive current to the light emitting element 3 according to the present embodiment has a single-gate structure. The initialization transistor IST, the pixel selection transistor SST, and the reset transistor RST have a double-gate structure. This configuration can prevent current leakage in the initialization transistor IST, the pixel selection transistor SST, and the reset transistor RST.

Figure 5:
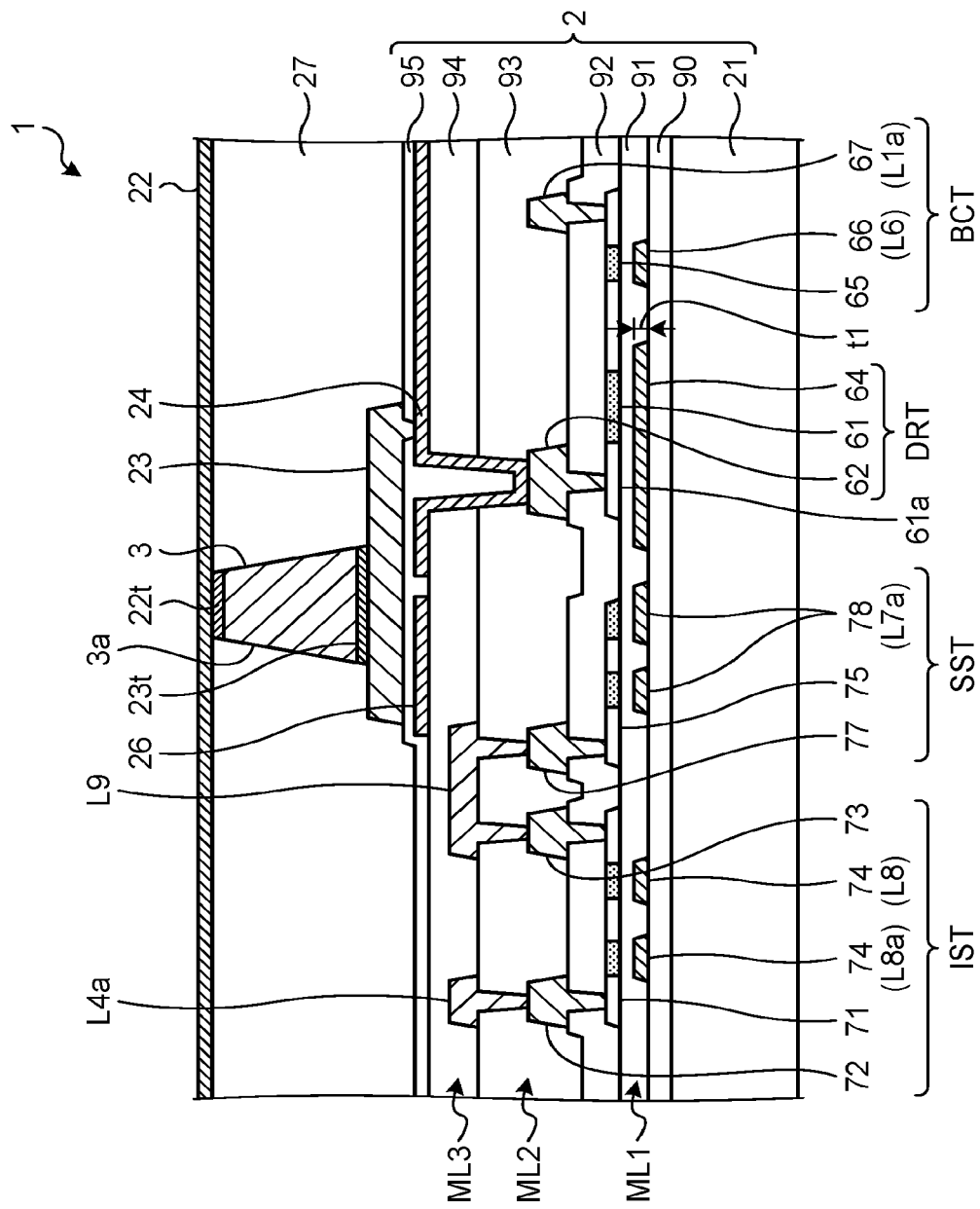
FIG. 5 is a sectional view along line V-V' of FIG. 4.
Figure 6:
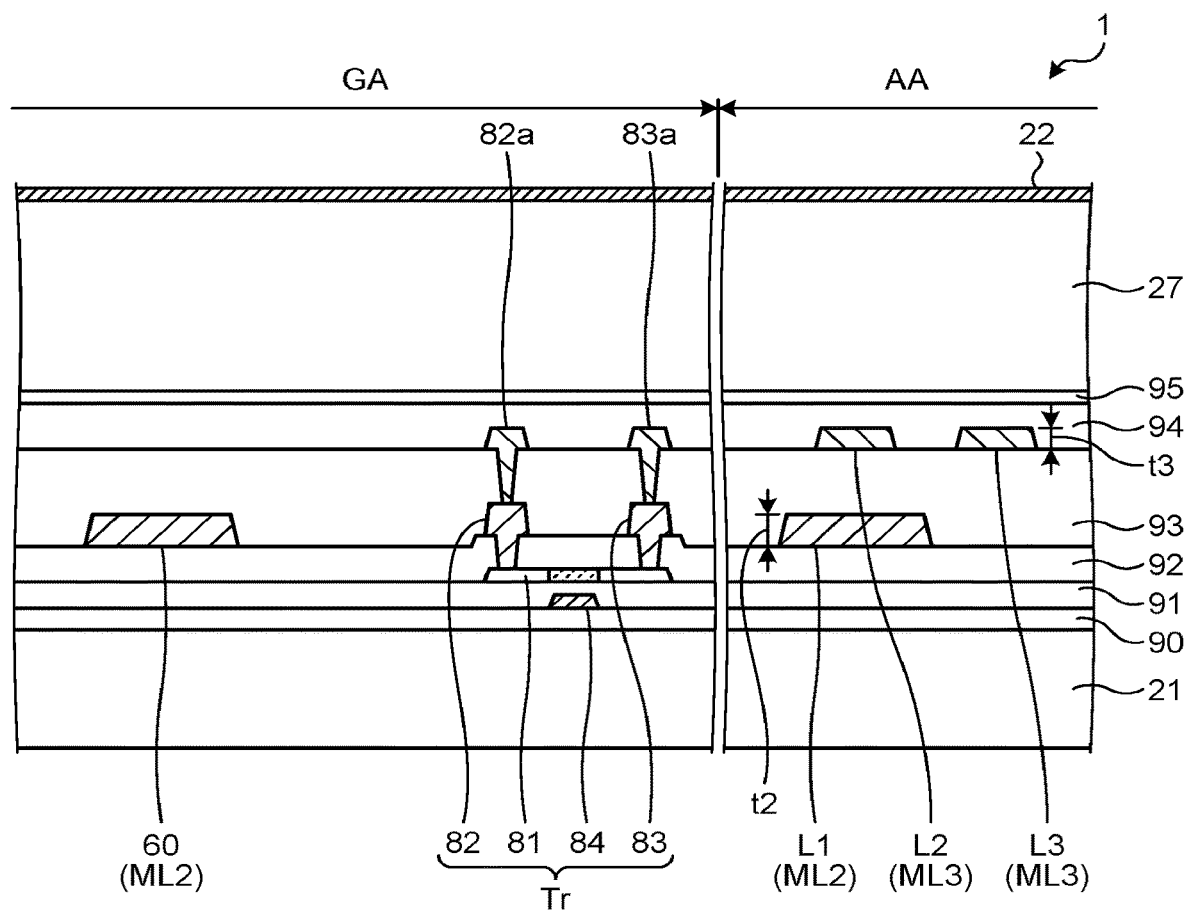
FIG. 6 is a sectional view along line VI-VI' of FIG. 4.
Figure 7:
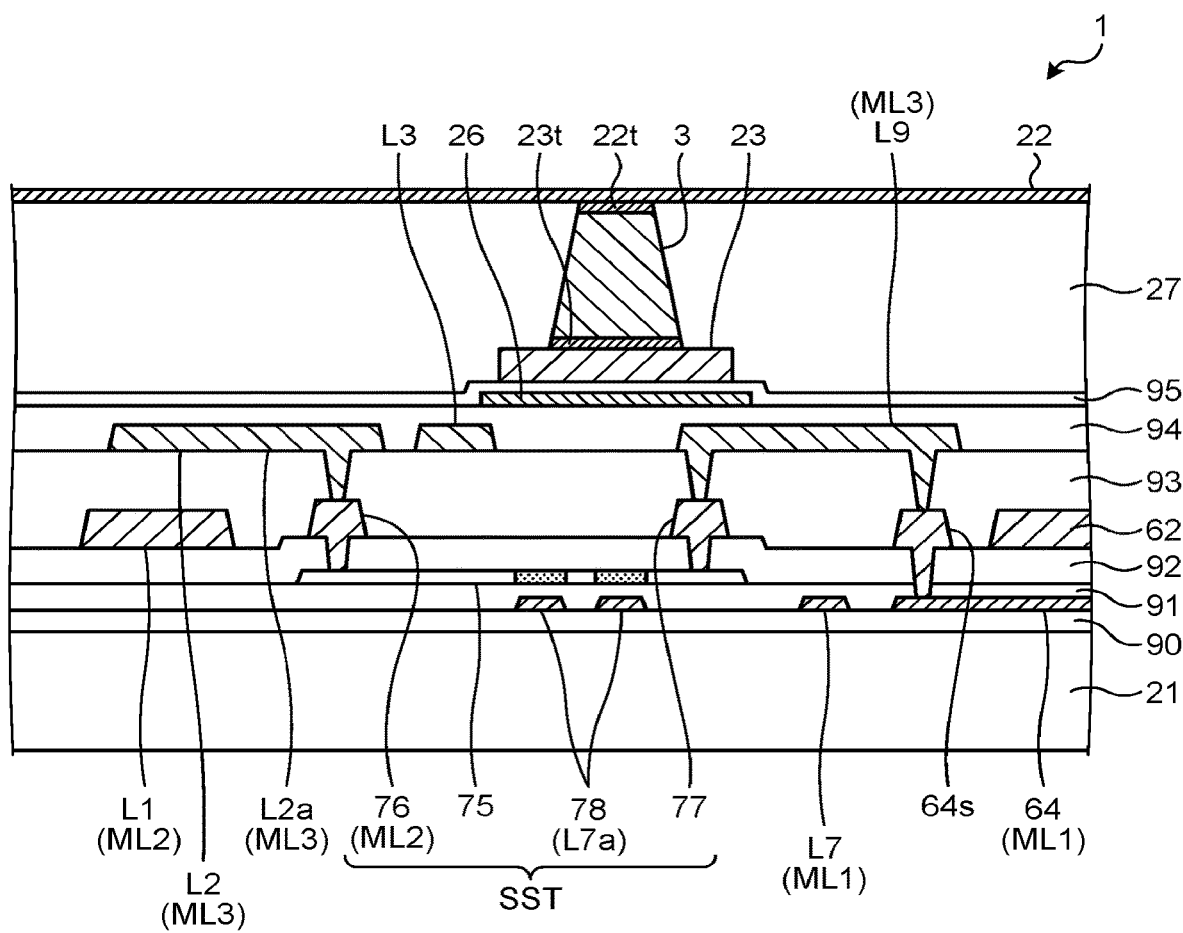
FIG. 7 is a sectional view along line VII-VII' of FIG. 4.

The following describes a sectional configuration of the display device 1. FIG. 5 is a sectional view along line V-V' of FIG. 4. FIG. 6 is a sectional view along line VI-VI' of FIG. 4. FIG. 7 is a sectional view along line VII-VII' of FIG. 4. FIG. 6 schematically illustrates the cathode wiring 60 and a transistor Tr provided in the peripheral region GA.

As illustrated in FIG. 5, the light emitting element 3 is provided on the array substrate 2. The array substrate 2 includes the substrate 21, various transistors, various kinds of wiring, and various insulating films. The substrate 21 is an insulating substrate and is a glass substrate, a resin substrate, or a resin film, for example.

In the present specification, a direction from the substrate 21 to a flattening film 27 in a direction perpendicular to the surface of the substrate 21 is referred to as an "upper side". A direction from the flattening film 27 to the substrate 21 is referred to as a "lower side".

The drive transistor DRT, the output transistor BCT, the initialization transistor IST, the pixel selection transistor SST, and the reset transistor RST (not illustrated in FIG. 5) are provided on a first surface of the substrate 21. An undercoat film 90, the first metal layer ML1, the gate insulating film 91, the semiconductor layers 61, 65, 71, and 75, a first insulating film 92, the second metal layer ML2, a second insulating film 93, the third metal layer ML3, and a third insulating film 94 are layered in order on the first surface of the substrate 21. In other words, the first insulating film 92 is provided between the first metal layer ML1 and the second metal layer ML2 in the direction perpendicular to the substrate 21. The second insulating film 93 is provided between the second metal layer ML2 and the third metal layer ML3.

The anode coupling electrode 24 and a shield electrode 26 are provided on the third insulating film 94. The anode electrode 23 and the light emitting element 3 are provided on the anode coupling electrode 24 and the shield electrode 26 with a fourth insulating film 95 interposed therebetween. The shield electrode 26 is provided to shield the transistors and the light emitting element 3 from each other and also serves as the second capacitance Cs2 illustrated in FIG. 3.

In the display device 1, the array substrate 2 includes the layers from the substrate 21 to the anode electrode 23. The array substrate 2 does not include the flattening film 27, the cathode electrode 22, or the light emitting element 3.

The undercoat film 90, the gate insulating film 91, the first insulating film 92, and the fourth insulating film 95 are made of inorganic insulating material, such as a silicon oxide film (SiO), a silicon nitride film (SiN), and a silicon oxynitride film (SiON). The inorganic insulating films are not limited to single layers and may be multilayered films. The undercoat film 90 is not necessarily provided. The second insulating film 93, the third insulating film 94, and the flattening film 27 are organic insulating films or inorganic-organic hybrid insulating films (made of material in which an organic group (a methyl group or a phenyl group) is bonded to a main chain of Si—O, for example). One of the second insulating film 93 and the third insulating film 94 may be an inorganic insulating film.

The gate electrodes 64, 66, 74, and 78 formed in the first metal layer ML1 are provided on the substrate 21 with the undercoat film 90 interposed therebetween. The gate insulating film 91 is provided on the undercoat film 90 to cover the gate electrodes 64, 66, 74, and 78. The semiconductor layers 61, 65, 71, and 75 are provided on the gate insulating film 91. The first insulating film 92 is provided on the gate insulating film 91 to cover the semiconductor layers 61, 65, 71, and 75.

In the example illustrated in FIG. 5, the transistors have what is called a bottom-gate structure. The transistors may have a top-gate structure in which the gate electrode is provided on the semiconductor layer. Alternatively, the transistors may have a dual-gate structure in which the gate electrodes are provided both on and under the semiconductor layer.

The source electrodes 62 and 72 and the drain electrodes 67, 73, and 77 formed in the second metal layer ML2 are provided on the first insulating film 92. The source electrodes 62 and 72 and the drain electrodes 67, 73, and 77 are each electrically coupled to the semiconductor layer through a contact hole formed in the first insulating film 92.

The second insulating film 93 is provided on the first insulating film 92 to cover the source electrodes 62 and 72 and the drain electrodes 67, 73, and 77. The coupling wiring L9 and the initialization power supply line coupling part L4a formed in the third metal layer ML3 are provided on the second insulating film 93. The coupling wiring L9 is coupled to the drain electrode 73 of the initialization transistor IST and the drain electrode 77 of the pixel selection transistor SST through contact holes formed in the second insulating film 93. As a result, the drain of the pixel selection transistor SST and the drain of the initialization transistor IST are electrically coupled. The initialization power supply line coupling part L4a is coupled to the source electrode 72 through a contact hole formed in the second insulating film 93.

The third insulating film 94 is provided on the second insulating film 93 to cover the coupling wiring L9 and the initialization power supply line coupling part L4a. The anode coupling electrode 24 and the shield electrode 26 are provided on the third insulating film 94. The anode coupling electrode 24 is coupled to the source electrode 62 through a contact hole formed in the second insulating film 93 and the third insulating film 94. The second capacitance Cs2 (refer to FIG. 3) is formed between the anode coupling electrode 24 and the anode power supply line L1 and various kinds of wiring coupled to the anode power supply line L1 and between the anode power supply line L1 and the shield electrode 26. The shield electrode 26 is provided under the anode electrode 23 and the light emitting element 3.

The fourth insulating film 95 is provided on the third insulating film 94 to cover the anode coupling electrode 24 and the shield electrode 26. The anode electrode 23 is provided on the fourth insulating film 95. The anode electrode 23 is electrically coupled to the anode coupling electrode 24 through a contact hole formed in the fourth insulating film 95.

The light emitting element 3 is provided on the anode electrode 23, and the anode terminal 23t of the light emitting element 3 is coupled to the anode electrode 23. As a result, the anode terminal 23t of the light emitting element 3 is electrically coupled to the source electrode 62 of the drive transistor DRT.

The flattening film 27 is provided on the fourth insulating film 95 to cover at least side surfaces 3a of the light emitting element 3. The cathode electrode 22 is provided on the flattening film 27 and coupled to the cathode terminal 22t of the light emitting element 3. The cathode electrode 22 is provided from the display region AA to the peripheral region GA and electrically coupled to the light emitting elements 3 of a plurality of pixels 49.

As illustrated in FIG. 6, the peripheral region GA of the substrate 21 is provided with the transistors Tr serving as a plurality of transistors included in the drive circuits 12 (refer to FIG. 1) and the cathode wiring 60. The cathode wiring 60 is formed in the second metal layer ML2 and provided on the first insulating film 92 in the peripheral region GA. The cathode electrode 22 illustrated in FIG. 5 is electrically coupled to the cathode wiring 60. The cathode power supply line L10 illustrated in FIG. 3 includes the cathode wiring 60 and the cathode electrode 22. The cathode wiring 60 may be formed in the third metal layer ML3 and provided on the second insulating film 93.

The transistor Tr includes a semiconductor layer 81, a source electrode 82, a drain electrode 83, and a gate electrode 84. Detailed explanation of the transistor Tr is omitted herein because it has the same layer configuration as that of the transistors included in the pixel circuit PICA. The source electrode 82 and the drain electrode 83 of the transistor Tr are coupled to wires 82a and 83a, respectively, formed in the third metal layer ML3. This configuration enables efficiently disposing the wiring in the peripheral region GA including the drive circuits 12. The wires 82a and 83a may be formed in the second metal layer ML2 and provided in the same layer as that of the source electrode 82 and the drain electrode 83.

As illustrated in FIG. 6, the video signal line L2 is provided on the anode power supply line L1. The reset power supply line L3 is provided at a position not overlapping the anode power supply line L1. The width of the anode power supply line L1 is larger than those of the video signal line L2 and the reset power supply line L3. The thickness t2 of the anode power supply line L1 (second metal layer ML2) is larger than the thickness t1 (refer to FIG. 5) of the gate electrode 64 (first metal layer ML1). The thickness t2 of the anode power supply line L1 (second metal layer ML2) is larger than the thickness t3 of the video signal line L2 and the reset power supply line L3 (third metal layer ML3). This configuration can reduce the resistance of the anode power supply line L1.

The layer configuration of the wiring can be appropriately modified. The anode power supply line L1 may be provided on the video signal line L2, for example. In other words, the anode power supply line L1 may be formed in the third metal layer ML3 and provided on the second insulating film 93, and the video signal line L2 and the reset power supply line L3 may be formed in the second metal layer ML2 and provided on the first insulating film 92.

The relative permittivity of the first insulating film 92 according to the present embodiment is higher than that of the second insulating film 93 and the third insulating film 94. The anode power supply line L1 faces the various gate lines (the reset control signal line L5, the output control signal line L6, the pixel control signal line L7, and the initialization control signal line L8 (refer to FIG. 4)) with the first insulating film 92 interposed therebetween. The first insulating film 92 having high relative permittivity increases the capacitance formed between the anode power supply line L1 and the various gate lines. The capacitance formed in the anode power supply line L1 is used as a decoupling capacitor. The decoupling capacitor can absorb fluctuations in the anode power supply potential PVDD and enable the drive IC 210 to stably operate. In addition, the decoupling capacitor can prevent electromagnetic noise generated in the display device 1 from leaking outside.

FIG. 7 is a sectional view of the pixel selection transistor SST serving as an example of a coupling configuration of the transistors included in the pixel circuit PICA. The pixel selection transistor SST includes a source electrode 76 formed in the second metal layer ML2. The source electrode 76 is coupled to the semiconductor layer 75 through a contact hole formed in the first insulating film 92. The video signal line L2 (video signal line coupling part L2a) is coupled to the source electrode 76 through a contact hole formed in the second insulating film 93. In other words, the video signal line L2 is electrically coupled to the semiconductor layer 75 via a relay electrode (source electrode 76) formed in the second metal layer ML2.

The drain electrode 77 is coupled to the semiconductor layer 75 through a contact hole formed in the first insulating film 92. The coupling wiring L9 is coupled to the drain electrode 77 through a contact hole formed in the second insulating film 93. The gate electrode 64 of the drive transistor DRT is coupled to a relay electrode 64s formed in the second metal layer ML2. The coupling wiring L9 is coupled to the relay electrode 64s through a contact hole formed in the second insulating film 93. With this configuration, the gate electrode 64 of the drive transistor DRT is electrically coupled to the semiconductor layer 75 of the pixel selection transistor SST via the coupling wiring L9 formed in the third metal layer ML3.

As described above, the display device 1 according to the present embodiment includes the substrate 21, the pixels 49, the light emitting elements 3 and the transistors, the signal lines, the first metal layer ML1, the second metal layer ML2, and the third metal layer ML3, the first insulating film 92, and the second insulating film 93. The pixels 49 are provided to the substrate 21. The light emitting element 3 and the transistors (the drive transistor DRT, the output transistor BCT, the initialization transistor IST, the pixel selection transistor SST, and the reset transistor RST) are provided to each of the pixels 49. The signal lines (the video signal line L2, the reset power supply line L3, and the initialization power supply line L4) supply signals to the pixels 49. The first metal layer ML1, the second metal layer ML2, and the third metal layer ML3 are provided in different layers in the direction perpendicular to the substrate 21. The first insulating film 92 is provided between the first metal layer ML1 and the second metal layer ML2. The second insulating film 93 is provided between the second metal layer ML2 and the third metal layer ML3. At least one of the transistors (e.g., the pixel selection transistor SST) includes the semiconductor layer 75 and the gate electrode 78. The semiconductor layer 75 is provided to the substrate 21. The gate electrode 78 is formed in the first metal layer ML1 and provided in a region overlapping the semiconductor layer 75. The signal line (e.g., the video signal line L2) is formed in the third metal layer ML3 and electrically coupled to the semiconductor layer 75.

If the pixels 49 each include a plurality of transistors in the display device 1 (array substrate 2), a plurality of wires, such as the power supply lines, the signal lines, and the gate lines, coupled to the transistors can be formed in the first metal layer ML1, the second metal layer ML2, and the third metal layer ML3. This configuration increases the flexibility in disposing the wires, thereby enabling efficiently disposing the wiring in the display device 1 (array substrate 2).

Figure 8:
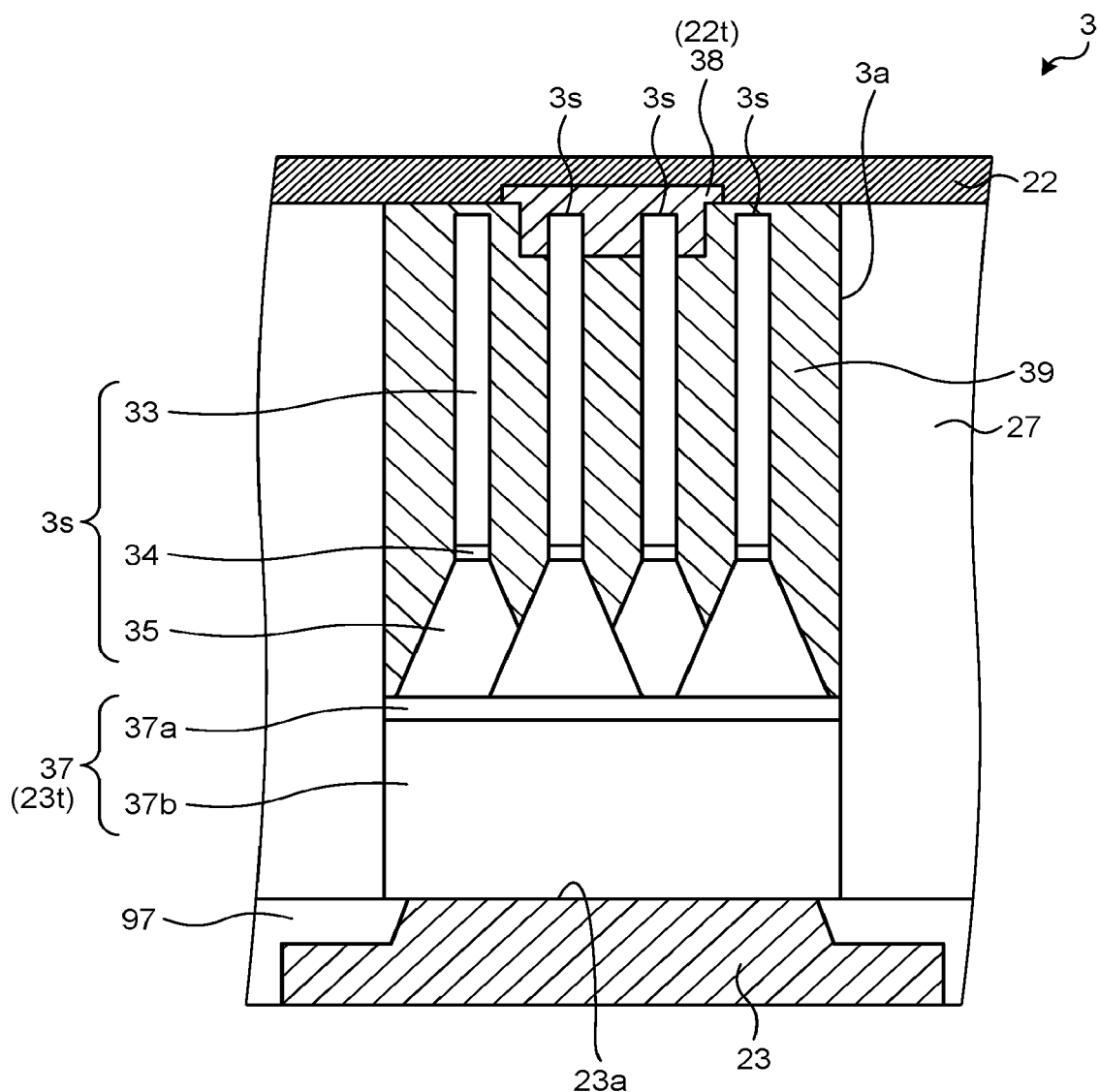
FIG. 8 is a sectional view of a light emitting element according to the embodiment.

FIG. 8 is a sectional view of the light emitting element according to the embodiment. In the display device 1 according to the present embodiment, the light emitting element 3 has what is called a face-up structure in which the anode terminal 23t is provided at the lower part and the cathode terminal 22t is provided at the upper part.

As illustrated in FIG. 8, the light emitting element 3 includes a plurality of partial light emitting elements 3s, a protective layer 39, a p-type electrode 37, and an n-type electrode 38. The protective layer 39 covers the partial light emitting elements 3s. The partial light emitting elements 3s have a columnar shape and are provided between the p-type electrode 37 and the n-type electrode 38. The partial light emitting elements 3s each include an n-type cladding layer 33, an active layer 34, and a p-type cladding layer 35. The n-type electrode 38 is electrically coupled to the n-type cladding layer 33. The p-type electrode 37 is electrically coupled to the p-type cladding layer 35. The p-type cladding layer 35, the active layer 34, and the n-type cladding layer 33 are layered in order on the p-type electrode 37. The n-type cladding layer 33, the active layer 34, and the p-type cladding layer 35 are light emitting layers and are made of a compound semiconductor, such as gallium nitride (GaN) and aluminum indium phosphorus (AlInP).

The n-type electrode 38 is made of translucent conductive material, such as ITO. The n-type electrode 38 serves as the cathode terminal 22t of the light emitting element 3 and is coupled to the cathode electrode 22. The p-type electrode 37 serves as the anode terminal 23t of the light emitting element 3 and includes a Pt layer 37a and a thick Au layer 37b produced by plating. The thick Au layer 37b is coupled to a placement surface 23a of the anode electrode 23.

The protective layer 39 is spin on glass (SOG), for example. The side surfaces of the protective layer 39 correspond to the side surfaces 3a of the light emitting element 3. The flattening film 27 is provided surrounding the side surfaces of the protective layer 39.

First Modification

Figure 9:
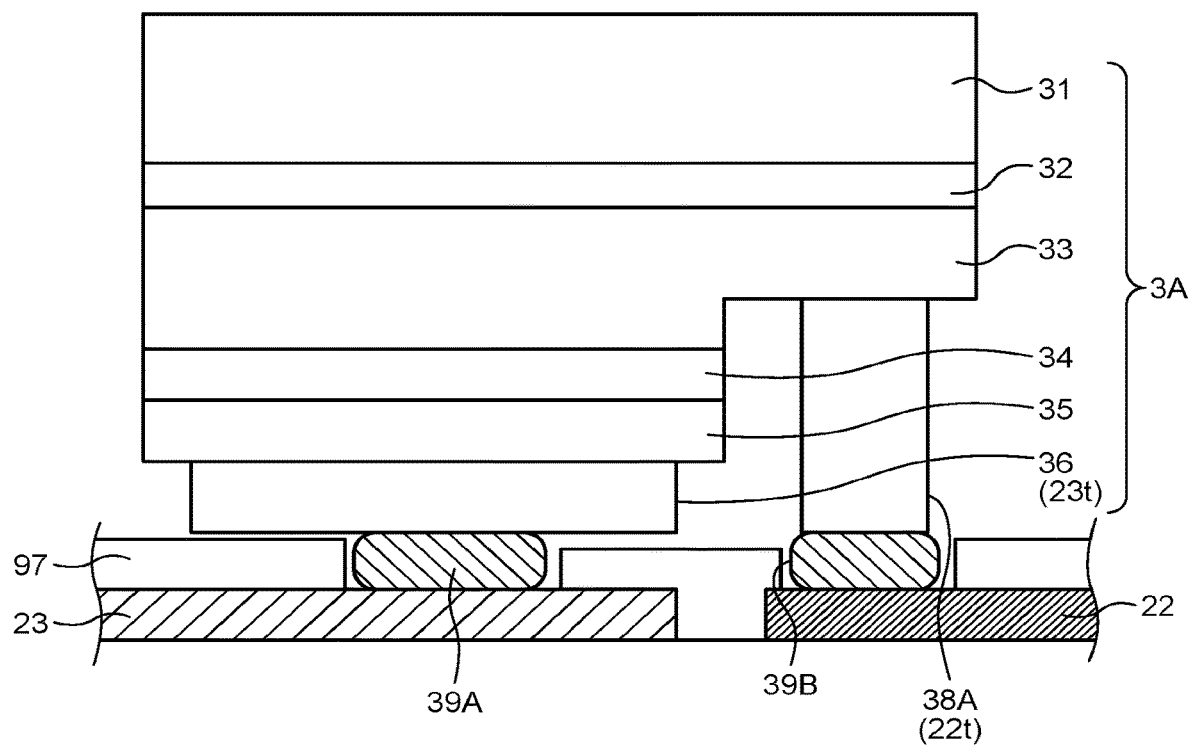
FIG. 9 is a sectional view of the light emitting element according to a first modification of the embodiment.

FIG. 9 is a sectional view of the light emitting element according to a first modification of the embodiment. In the display device 1, the light emitting element 3 does not necessarily have a face-up structure. Alternatively, the light emitting element 3 may have what is called a face-down structure in which the lower part of the light emitting element 3 is coupled to the anode electrode 23 and the cathode electrode 22.

As illustrated in FIG. 9, in a light emitting element 3A, a buffer layer 32, the n-type cladding layer 33, the active layer 34, the p-type cladding layer 35, and a p-type electrode 36 are layered in order on a translucent substrate 31. In the light emitting element 3A, the translucent substrate 31 is provided at the upper part, and the p-type electrode 36 is provided at the lower part. The surface of the n-type cladding layer 33 facing the cathode electrode 22 has a region exposed from the active layer 34. This region is provided with an n-type electrode 38A.

The p-type electrode 36 is made of material having metallic luster that reflects light from the light emitting layers. The p-type electrode 36 is coupled to the anode electrode 23 with a bump 39A interposed therebetween. The n-type electrode 38A is coupled to the cathode electrode 22 with a bump 39B interposed therebetween. An insulating film 97 covers the cathode electrode 22 and the anode electrode 23. The bumps 39A and 39B are coupled to the anode electrode 23 and the cathode electrode 22, respectively, through openings in the insulating film 97.

In the light emitting element 3A, the p-type cladding layer 35 and the n-type cladding layer 33 are not directly bonded, and another layer (active layer 34) is provided therebetween. With this configuration, carriers, such as electrons and holes, can be concentrated in the active layer 34, thereby efficiently recombining the carriers (emitting light). The active layer 34 may have a multi-quantum well structure (MQW structure) in which well layers and barrier layers composed of several atomic layers are cyclically layered for higher efficiency.

Second Modification

Figure 10:
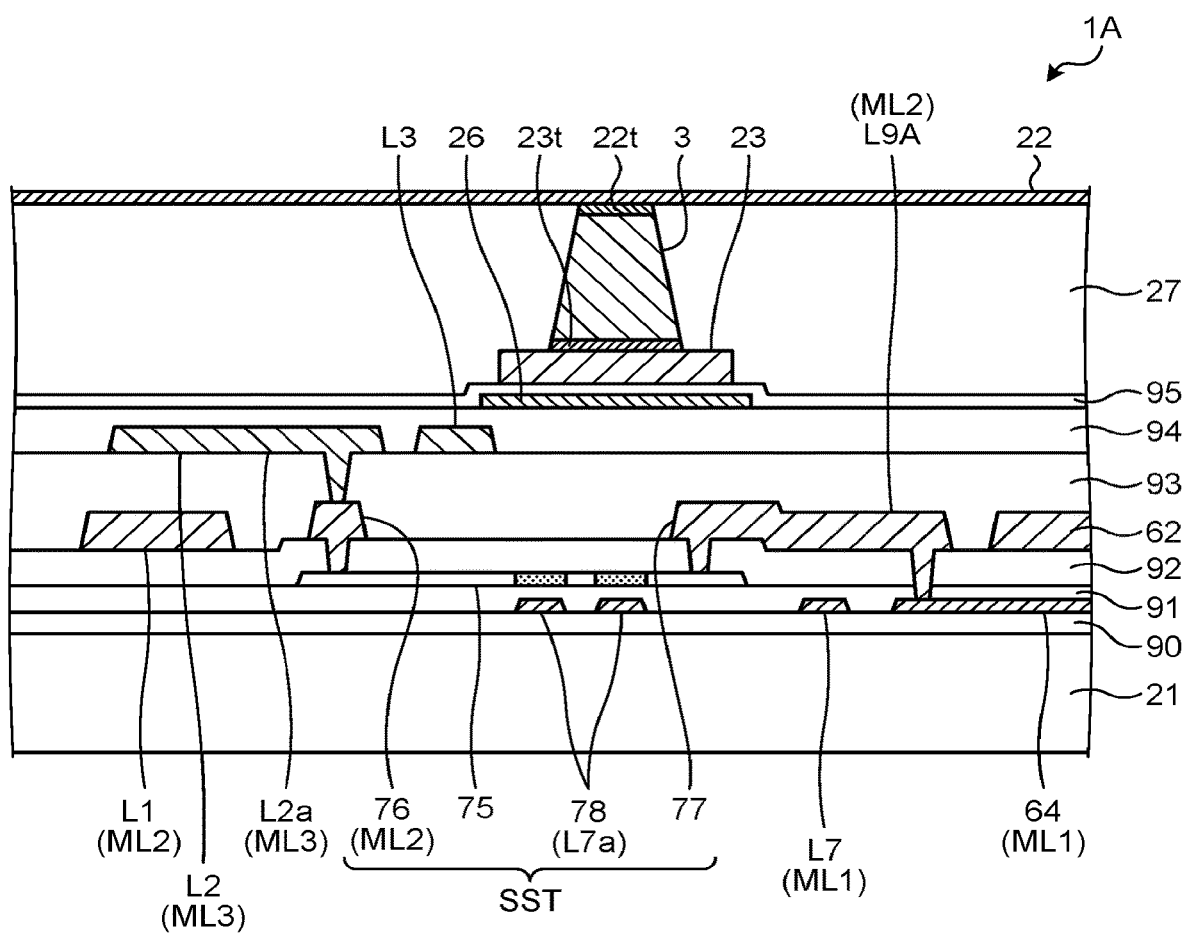
FIG. 10 is a sectional view of the display device according to a second modification of the embodiment.

FIG. 10 is a sectional view of the display device according to a second modification of the embodiment. FIG. 10 is a sectional view of the pixel selection transistor SST similarly to FIG. 7. A display device 1A according to the present modification is different from the display device 1 in that coupling wiring L9A is formed in the second metal layer ML2.

As illustrated in FIG. 10, the coupling wiring L9A is provided on the first insulating film 92. The coupling wiring L9A is electrically coupled to the semiconductor layer 75 of the pixel selection transistor SST through a contact hole formed in the first insulating film 92 not via any relay electrode. The part of the coupling wiring L9A overlapping the semiconductor layer 75 functions as the drain electrode 77. The coupling wiring L9A is electrically coupled to the gate electrode 64 through a contact hole formed in the first insulating film 92 and the gate insulating film 91 not via any relay electrode. With this configuration, the gate electrode 64 of the drive transistor DRT is electrically coupled to the semiconductor layer 75 of the pixel selection transistor SST via the coupling wiring L9A formed in the second metal layer ML2.

Wiring or the like may be disposed in the layers on the coupling wiring L9A because the coupling wiring L9A is formed in the second metal layer ML2. Consequently, the present modification enables efficiently disposing the wiring.

Third Modification

Figure 11:
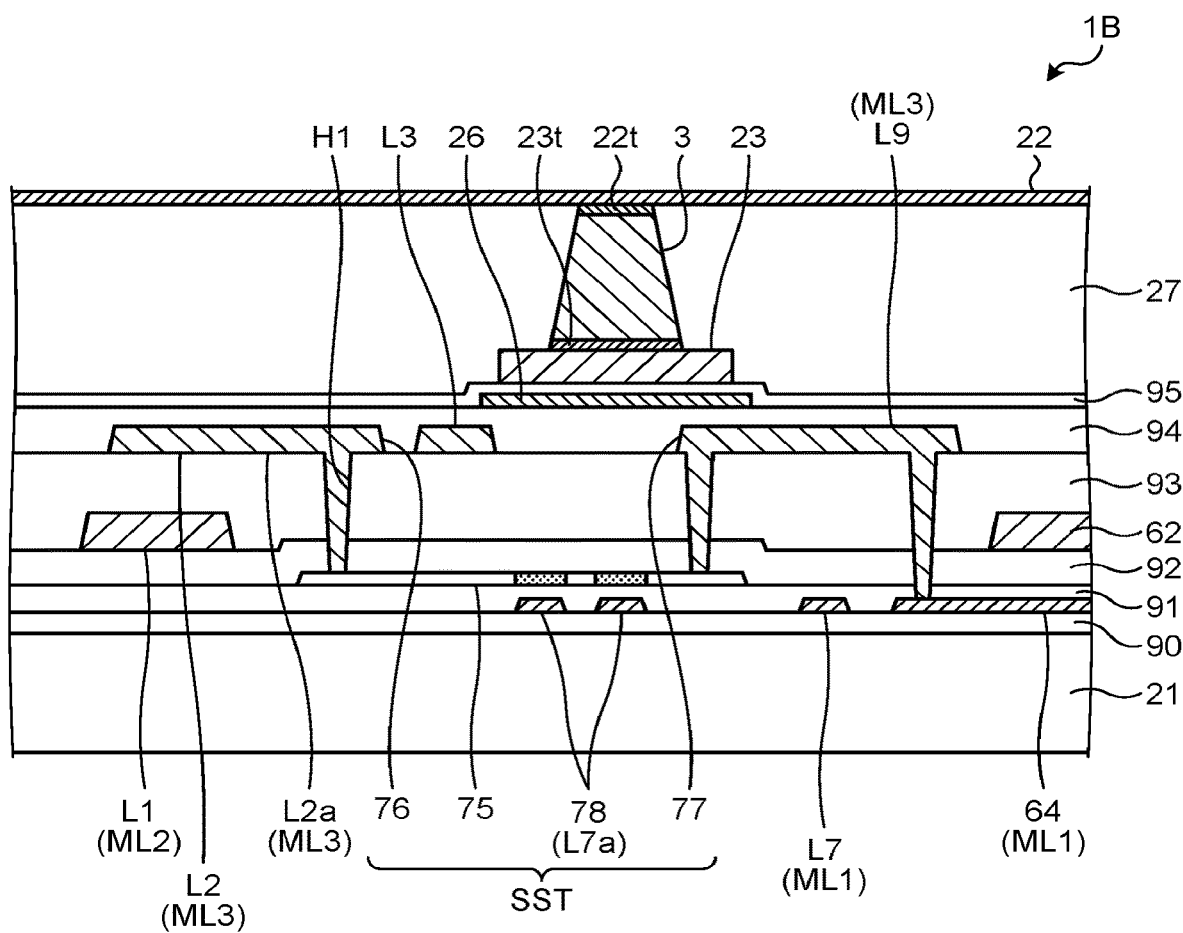
FIG. 11 is a sectional view of the display device according to a third modification of the embodiment.

FIG. 11 is a sectional view of the display device according to a third modification of the embodiment. A display device 1B according to the present modification is different from the display devices 1 and 1A in that no relay electrode (source electrode 76) formed in the second metal layer ML2 is provided between the video signal line L2 and the semiconductor layer 75. The display device 1B does not include the drain electrode 77 or the relay electrode 64s formed in the second metal layer ML2 for the coupling wiring L9.

As illustrated in FIG. 11, a contact hole H1 is formed between the video signal line L2 (video signal line coupling part L2a) and the semiconductor layer 75. The contact hole H1 passes through the first insulating film 92 and the second insulating film 93 in the direction perpendicular to the substrate 21. The video signal line L2 is electrically coupled to the semiconductor layer 75 of the pixel selection transistor SST through the contact hole H1. In the present modification, the part of the video signal line coupling part L2a overlapping the semiconductor layer 75 functions as the source electrode 76. The coupling wiring L9 is electrically coupled to the semiconductor layer 75 of the pixel selection transistor SST through a contact hole passing through the first insulating film 92 and the second insulating film 93 not via any relay electrode. The part of the coupling wiring L9 overlapping the semiconductor layer 75 functions as the drain electrode 77. The coupling wiring L9 is electrically coupled to the gate electrode 64 through a contact hole formed in the first insulating film 92, the second insulating film 93, and the gate insulating film 91 not via any relay electrode.

This configuration can increase the space for disposing the wiring on the first insulating film 92 compared with the configuration provided with a relay electrode, thereby enabling efficiently disposing the wiring. The configuration of the present modification is not necessarily applied to the pixel selection transistor SST and is also applicable to coupling between the semiconductor layer and the signal lines in each transistor.

Figure 12:
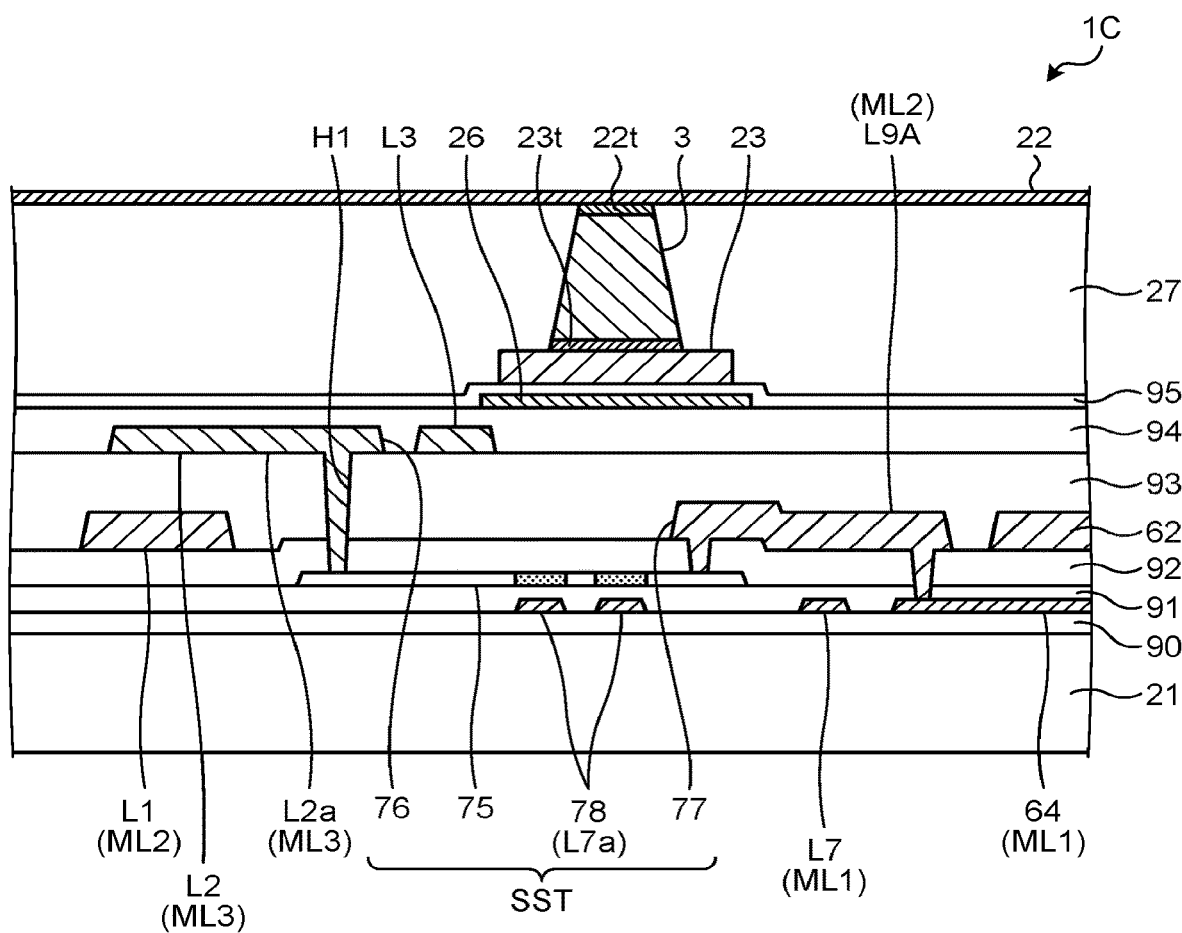
FIG. 12 is a sectional view of the display device according to a fourth modification of the embodiment.

Fourth modification FIG. 12 is a sectional view of the display device according to a fourth modification of the embodiment. A display device 1C according to the present modification is different from the display devices 1, 1A, and 1B in that the coupling wiring L9A is formed in the second metal layer ML2 and that no relay electrode (source electrode 62) formed in the second metal layer ML2 is provided between the video signal line L2 and the semiconductor layer 75.

As illustrated in FIG. 12, the coupling configuration of the coupling wiring L9A is the same as that of the second modification, and the coupling configuration of the video signal line L2 is the same as that of the third modification. Not only the coupling wiring L9A and the video signal line L2 but also the other wiring may be formed by appropriately combining the first metal layer ML1, the second metal layer ML2, and the third metal layer ML3. The coupling configuration between the layers may be implemented by appropriately combining the first metal layer ML1, the second metal layer ML2, and the third metal layer ML3.

Fifth Modification

Figure 13:
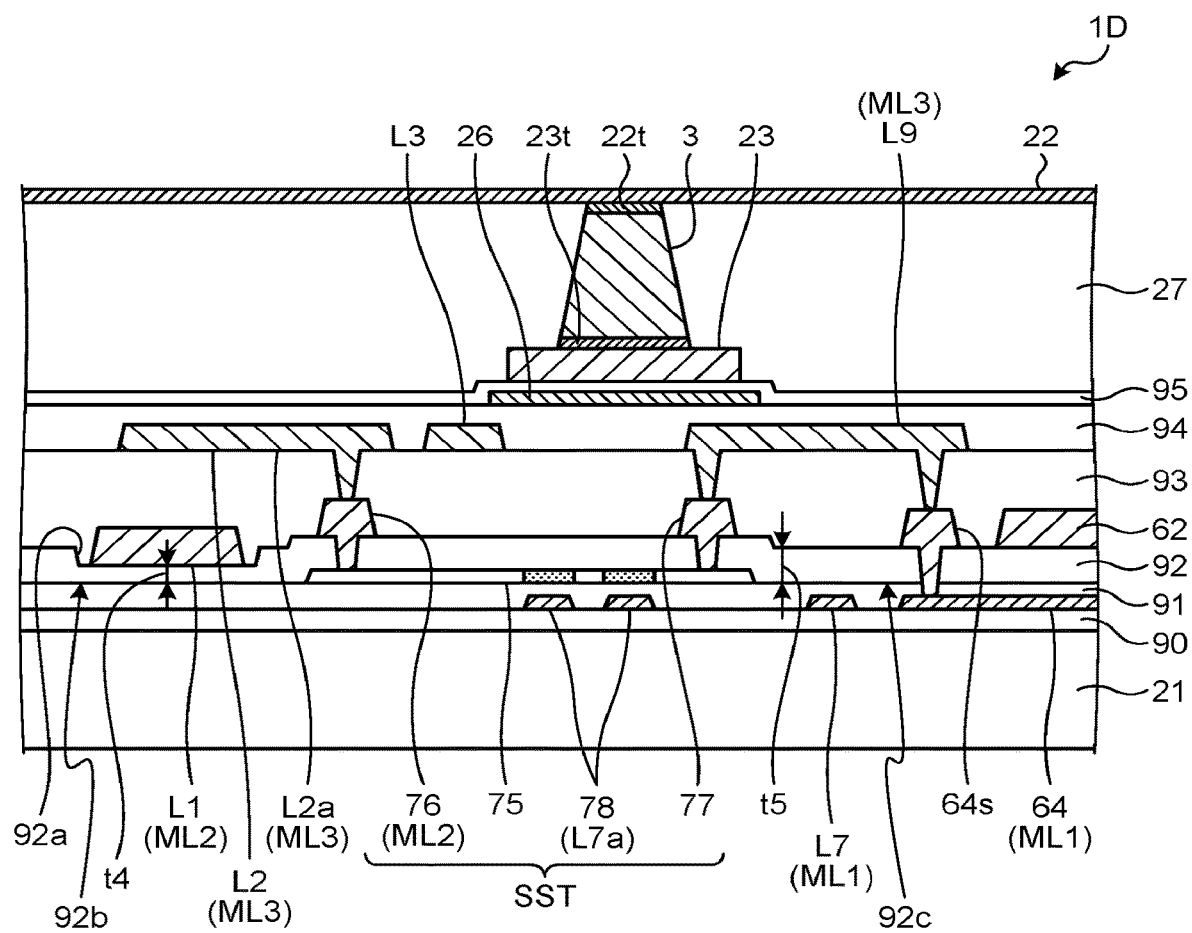
FIG. 13 is a sectional view of the display device according to a fifth modification of the embodiment.

FIG. 13 is a sectional view of the display device according to a fifth modification of the embodiment. A display device 1D according to the present modification is different from the display devices 1, 1A, 1B, and 1C in that the first insulating film 92 has a recess 92a.

As illustrated in FIG. 13, the anode power supply line L1 is provided in the recess 92a. In other words, the first insulating film 92 has a first part 92b overlapping the anode power supply line L1 and a second part 92c not overlapping the anode power supply line L1. The thickness t4 of the first part 92b is smaller than the thickness t5 of the second part 92c.

This configuration increases the capacitance formed between the anode power supply line L1 and the various gate lines. In other words, the capacitance used as a decoupling capacitor increases. The decoupling capacitor can absorb fluctuations in the anode power supply potential PVDD and enable the drive IC 210 to stably operate. In addition, the decoupling capacitor can prevent electromagnetic noise generated in the display device 1D from leaking outside.

The configuration of the present modification can be combined with the first to the fourth modifications.

The configuration of the pixel circuit PICA illustrated in FIG. 3 can be appropriately modified. The number of wires and the number of transistors in one pixel 49 may be different from those illustrated in FIG. 3, for example. The pixel circuit PICA may be a current mirror circuit. Since a current mirror circuit has been described in Japanese Patent Application Laid-open Publication No. 2002-215093, for example, the present embodiment includes the related description in Japanese Patent Application Laid-open Publication No. 2002-215093, and thereby the explanation of the current mirror circuit is omitted herein.

While an exemplary embodiment according to the present disclosure has been described, the embodiment is not intended to limit the disclosure. The contents disclosed in the embodiment are given by way of example only, and various changes may be made without departing from the spirit of the present disclosure. Appropriate changes made without departing from the spirit of the present disclosure naturally fall within the technical scope of the disclosure. At least one of various omissions, substitutions, and changes of the components may be made without departing from the gist of the embodiment above and the modifications thereof.

What is claimed is:

1. A display device comprising:
a substrate;
a plurality of pixels provided to the substrate;
a light emitting element and a plurality of transistors provided to each of the pixels;
a plurality of signal lines configured to supply a signal to the pixels;
a power supply line configured to supply a drive potential to the pixels;
a first metal layer, a second metal layer, and a third metal layer provided in different layers in a first direction perpendicular to the substrate;
a first insulating film provided between the first metal layer and the second metal layer; and
a second insulating film provided between the second metal layer and the third metal layer,
wherein
the transistors each comprise:
a semiconductor layer provided to the substrate; and
a gate electrode formed in the first metal layer and provided in a region overlapping the semiconductor layer,
the signal lines are formed in the third metal layer and electrically coupled to the transistors,
the power supply line is formed in the second metal layer,
the power supply line overlaps at least one of the signal lines in planar view,
the first insulating film includes a first part overlapping the power supply line and a second part not overlapping the power supply line,
the thickness of the first part is smaller than the thickness of the second part,
an upper surface of the first part is closer to the substrate than an upper surface of the second part, in the first direction, and
relative permittivity of the first insulating film is higher than relative permittivity of the second insulating film.

2. The display device according to claim 1, wherein sheet resistance of the power supply line is equal to or lower than sheet resistance of the signal lines.

3. The display device according to claim 1, wherein the plurality of transistors in each pixel include:
a first transistor configured to supply an electric current to the light emitting element; and
a second transistor coupled to the first transistor,
the display device comprises gate lines formed in the first metal layer and coupled to the gate electrodes of the second transistors, and
sheet resistance of the signal lines is equal to or lower than sheet resistance of the gate lines.

4. The display device according to claim 3, wherein one gate electrode is provided overlapping the semiconductor layer of each of the first transistors, and
two gate electrodes are provided overlapping the semiconductor layer of each of the second transistors.

5. The display device according to claim 3, wherein at least one of the signal lines is electrically coupled to the semiconductor layer of the second transistor via a relay electrode formed in the second metal layer.

6. The display device according to claim 3, wherein a contact hole passing through the first insulating film and the second insulating film in the first direction is formed, and
at least one of the signal lines is electrically coupled to the semiconductor layer of the second transistor through the contact hole.

7. The display device according to claim 3, further comprising:
coupling wiring formed in the third metal layer, wherein the gate electrodes of the first transistors are electrically coupled to the semiconductor layers of the second transistors via the coupling wiring.

8. The display device according to claim 3, further comprising:
coupling wiring formed in the second metal layer, wherein
the gate electrodes of the first transistors are electrically coupled to the semiconductor layers of the second transistors via the coupling wiring.

* * * * *